US012020963B2

(12) United States Patent
Wu et al.

(10) Patent No.: US 12,020,963 B2
(45) Date of Patent: Jun. 25, 2024

(54) METHOD OF PERFORMING A SUBSTRATE DETECTION PROCESS

(71) Applicant: Taiwan Semiconductor Manufacturing Company, Ltd., Hsinchu (TW)

(72) Inventors: Min-Cheng Wu, Taitung County (TW); Chi-Hung Liao, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 742 days.

(21) Appl. No.: 17/119,818

(22) Filed: Dec. 11, 2020

(65) Prior Publication Data

US 2021/0098273 A1    Apr. 1, 2021

Related U.S. Application Data

(62) Division of application No. 15/991,688, filed on May 29, 2018, now Pat. No. 10,867,824.

(51) Int. Cl.
| | |
|---|---|
| *H01L 21/67* | (2006.01) |
| *G01N 21/88* | (2006.01) |
| *H01L 21/673* | (2006.01) |
| *H01L 21/677* | (2006.01) |
| *G01N 21/95* | (2006.01) |

(52) U.S. Cl.
CPC ....... *H01L 21/67288* (2013.01); *G01N 21/88* (2013.01); *H01L 21/67265* (2013.01); *H01L 21/67356* (2013.01); *H01L 21/67383* (2013.01); *H01L 21/67769* (2013.01); *G01N 21/9501* (2013.01)

(58) Field of Classification Search
CPC ......... H01L 21/67288; H01L 21/67265; H01L 21/67356; H01L 21/67383; H01L 21/67769; G01N 21/88; G01N 21/9501
USPC .......................................................... 73/103
See application file for complete search history.

(56) References Cited

U.S. PATENT DOCUMENTS

| | | | |
|---|---|---|---|
| 5,118,955 A | 6/1992 | Cheng | |
| 6,382,419 B1 * | 5/2002 | Fujimori | ........... H01L 21/67369 211/41.18 |
| 6,403,945 B2 | 6/2002 | Roessler et al. | |
| 6,411,377 B1 | 6/2002 | Noguchi et al. | |
| 6,443,002 B2 | 9/2002 | Blew et al. | |
| 6,509,577 B1 * | 1/2003 | Babikian | ............... G03F 7/2028 250/559.36 |

(Continued)

FOREIGN PATENT DOCUMENTS

JP        2001022053 A  *  1/2001

*Primary Examiner* — John Fitzgerald
(74) *Attorney, Agent, or Firm* — McClure, Qualey & Rodack, LLP

(57) ABSTRACT

A method of performing a substrate detection process is provided. The method includes emitting a signal to a surface of a substrate from an emitter disposed in a substrate storage container. The method also includes collecting the signal reflected from the surface of the substrate by a receiver disposed in the substrate storage container. The method further includes transmitting data corresponding to the collected signal to a signal processor. In addition, the method includes analyzing the data, and determining whether an action is to be performed on the substrate based on the analyzing.

20 Claims, 11 Drawing Sheets

(56) References Cited

U.S. PATENT DOCUMENTS

| | | | |
|---|---|---|---|
| 8,318,094 B1* | 11/2012 | Bayandorian | G01N 35/0099 422/62 |
| 9,401,016 B2 | 7/2016 | Kulkarni | |
| 10,139,221 B2 | 11/2018 | Qu et al. | |
| 10,867,824 B2* | 12/2020 | Wu | H01L 21/67386 |
| 2009/0016862 A1 | 1/2009 | Gould et al. | |
| 2010/0277749 A1 | 11/2010 | Rodnick et al. | |
| 2013/0267854 A1* | 10/2013 | Johnson | A61B 5/721 600/479 |
| 2016/0282109 A1* | 9/2016 | Qu | H01L 21/68771 |
| 2017/0062251 A1 | 3/2017 | Ayabe et al. | |
| 2018/0076078 A1* | 3/2018 | Tanaka | H01L 21/67769 |
| 2018/0233391 A1 | 8/2018 | Ogo | |
| 2019/0164790 A1 | 5/2019 | Liu | |
| 2019/0204144 A1* | 7/2019 | Oishi | G01N 29/12 |
| 2021/0151338 A1* | 5/2021 | Chandrasekaran | G01N 21/9501 |
| 2022/0044950 A1* | 2/2022 | Liang | H01L 23/544 |

* cited by examiner

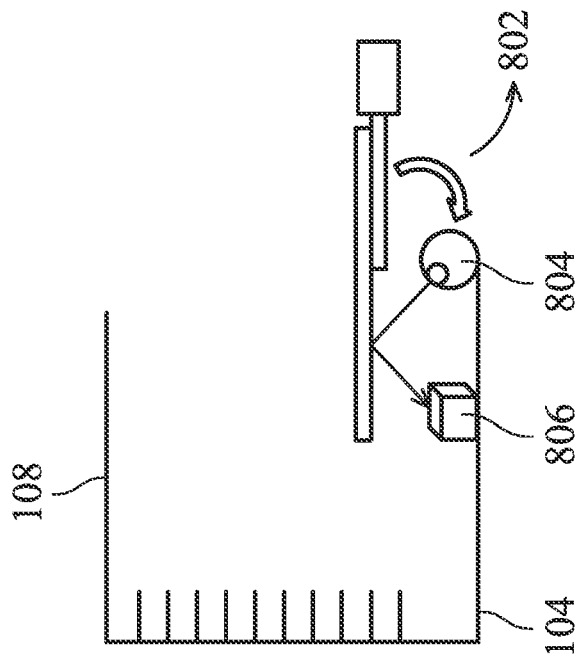
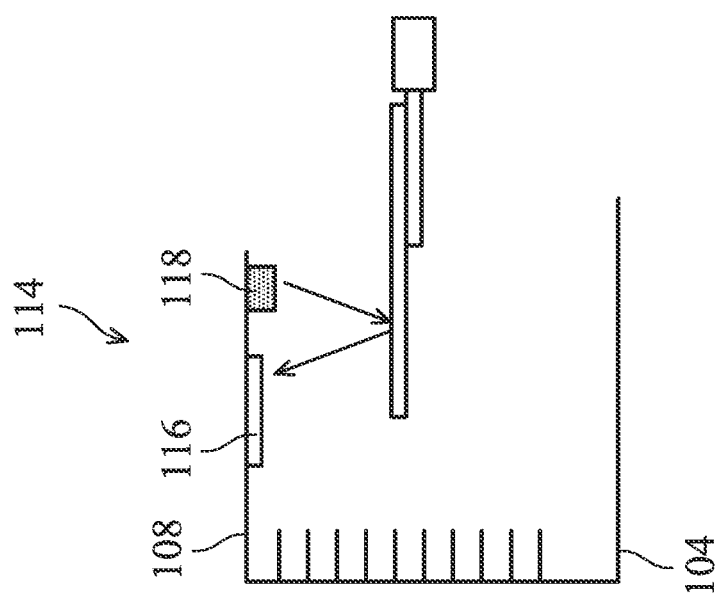
FIG. 8C
FIG. 8B

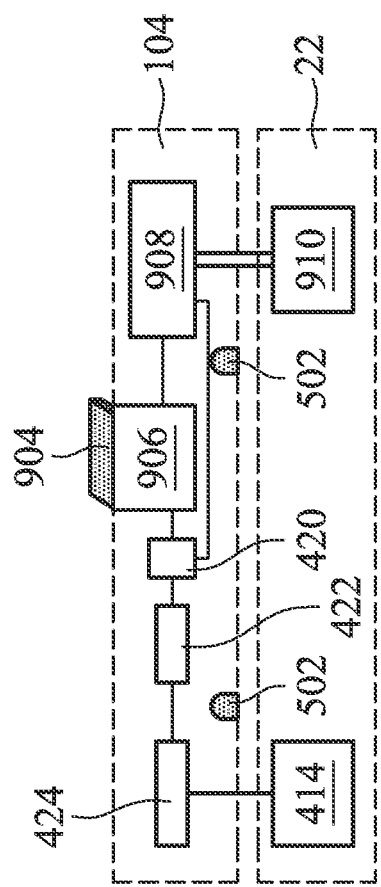
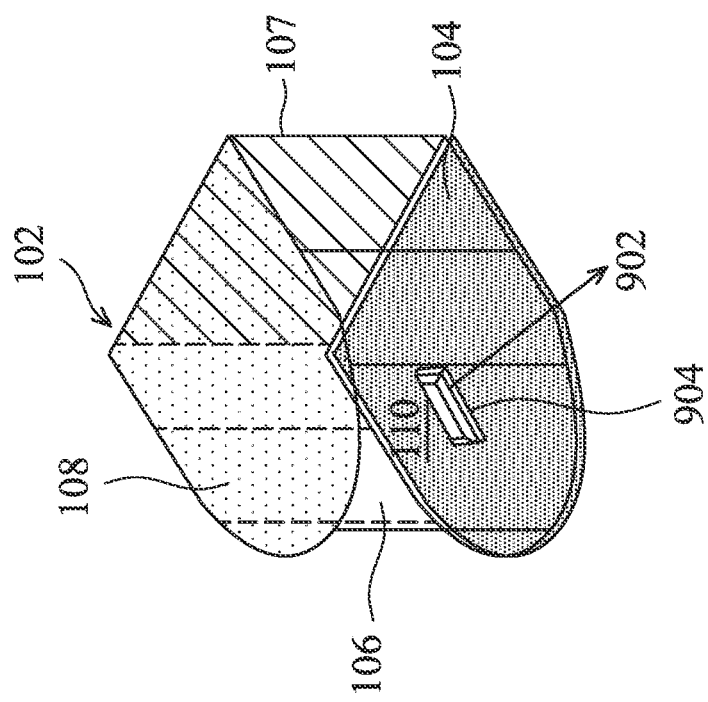
FIG. 9B
FIG. 9A

METHOD OF PERFORMING A SUBSTRATE DETECTION PROCESS

CROSS REFERENCE TO RELATED APPLICATIONS

This application is a divisional application of U.S. application Ser. No. 15/991,688, filed on May 29, 2018, now U.S. Pat. No. 10,867,824, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Photolithography has been used to form components on a chip. As the dimensions of the integrated circuit components are reduced, the lithography process is required to transfer even smaller features onto a substrate precisely, accurately, and without damage. Requirements for the substrate flatness have generally become increasingly important for lithography resolution enhancement. The desire of the high resolution lithography process has led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8B depicts a cross sectional view of another example of a substrate storage container with a rotatable substrate detecting system built therein in accordance with some embodiments;

FIG. 8C depicts a cross sectional view of another example of a substrate storage container with a substrate detecting system built therein in accordance with some embodiments;

FIG. 9A depicts a cross sectional view of a substrate storage container with a substrate detecting system built therein in accordance with some embodiments;

FIG. 9B depicts a schematic view of a base of the substrate storage container of FIG. 9A in accordance with some embodiments;

DETAILED DESCRIPTION

Figure 2:
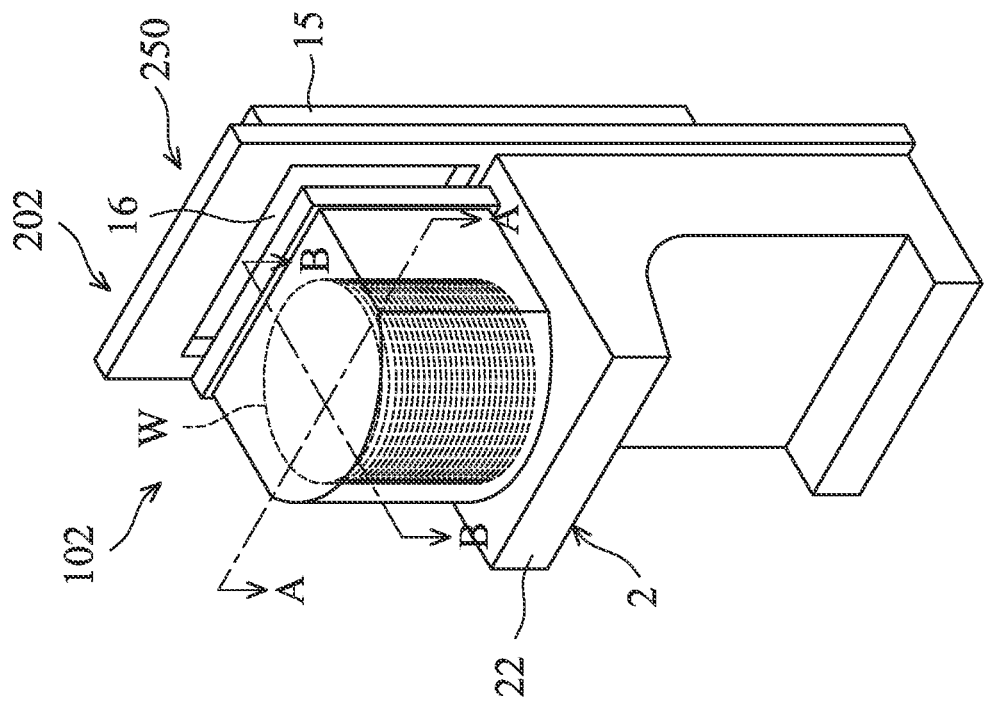
FIG. 2 depicts schematically a load port of an apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to a substrate detecting system disposed in a substrate storage container. The substrate detecting system includes at least an emitter and a receiver that can measure the substrate surface conditions, profiles, topography, warpage, and flatness of the substrates stored and/or transferred in and out of a substrate storage container. By utilizing the substrate detecting system embedded in the substrate storage container, the substrate surface conditions, profiles, topography, warpage, and/or flatness can be detected when the substrates are stored in the substrate storage container or transferred in and out of the substrate storage container. Thus, problematic substrates can be detected earlier and remedial actions can be executed earlier for the problematic substrates so as to save manufacturing cost and improve throughput and cycle times.

Figure 1:
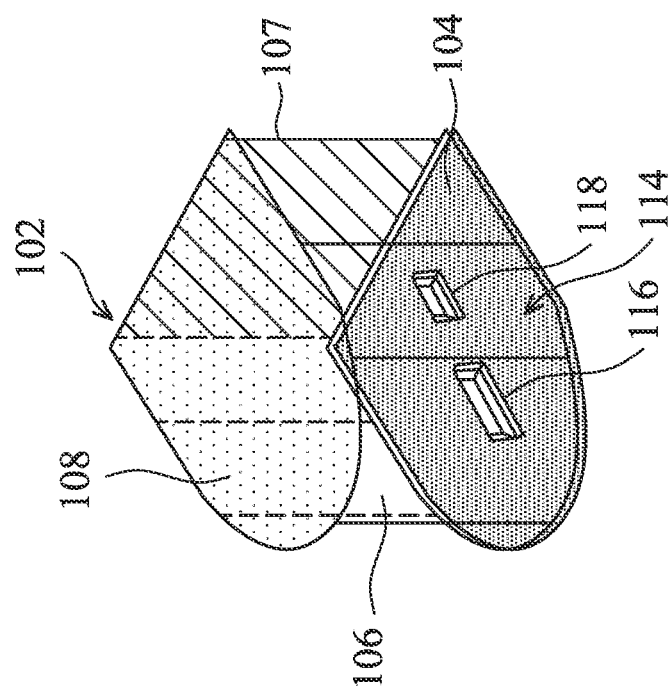
FIG. 1 depicts a perspective view of a substrate storage container in accordance with some embodiments.

FIG. 1 depicts a perspective view of a substrate storage container 102 in accordance with some embodiments. The substrate storage container 102 can store a plurality of semiconductor wafer substrates W (as shown in FIG. 2) therein. For example, a Front Opening Unified Pod (FOUP) is used as the substrate storage container 102 to carry the substrates W therein. The substrate storage container 102 includes a sidewall body 106 disposed on a base board 104 and below a lid 108 defining an interior volume 110 where the substrates W are stored. A plurality of slots 302 (shown in FIG. 3) is formed on the sidewall body 106 of the substrate storage container 102 so as to hold the substrates W in the substrate storage container 102 in desired positions. The sidewall body 106 includes a front door 107 that may be removable from the substrate storage container 102 so as to permit the substrates W to be transferred in and out of the substrate storage container 102. The substrate storage container 102 may have different dimensions to accommodate substrates W having different sizes to be positioned therein. For example, the substrate storage container 102 may have different dimensions to store substrates W having diameters of about 200 mm, 300 mm, or 450 mm.

A substrate detecting system 114 is positioned in the substrate storage container 102. The substrate detecting system 114 includes at least an emitter 118 and a receiver 116. In the example depicted in FIG. 1, the substrate detecting system 114 is placed on or built in the base board 104 of the substrate storage container 102. The emitter 118 provides a beam of light (e.g., a signal) to the substrates W in the substrate storage container 102. The beam of light reaches to a surface of the substrate W and is reflected back and collected by the receiver 116. The substrate detecting system 114 is used for detecting various substrate conditions, including substrate surface profile, displacement of the substrate, or substrate flatness conditions. It is noted that the substrate detecting system 114 may be positioned in any suitable locations in the substrate storage container 102 to facilitate measurement of the substrate conditions. Details of the substrate detecting system 114 will be further described below.

FIG. 2 depicts schematically a load port 202 of a processing apparatus 250 in accordance with some embodiments. The load port 202 functions as an interface between the processing apparatus 250, such as in various fabrication processes for manufacturing semiconductor devices on the substrate W. The load port 202 has a platform table 2 on which the substrate storage container 102 is to be mounted and placed. The platform table 2 has a base frame 22 which can mate with the base board 104 of the substrate storage container 102. A port window 16 is on a front side of the load port 202 to receive the front door 107 of the substrate storage container 102. A port door 15 is disposed adjacent to the port window 16 adapted to dock onto the front door 107 of the substrate storage container 102. Once the front door 107 is docked onto the port window 16, the front door 107 may be unlocked and removed from the substrate storage container 102 so as to allow access of a substrate handler to the interior volume 110 of the substrate storage container 102. The front door 107 may be removable from the substrate storage container 102. The front door 107 may be moved in vertical or lateral directions by the port door 15 to allow open communication between the interior volume 110 of the substrate storage container 102 to the inside of the processing apparatus 250 onto which the load port 202 is hooked or docked.

In an example, the base board 104 is positioned on the base frame 22 of the platform table 2, and the base board 104 is movable by the platform table 2 in a translation direction towards and away from the port window 16 by a slider mechanism (not shown). Once the base board 104 is mounted onto the base frame 22, the substrate storage container 102 may be moved in a direction toward the port window 16 to a position where the port door 15 performs an operation to open and close the front door 107 to allow transfer of the substrates W into and out of the interior volume 110 of the substrate storage container 102.

Figure 3:
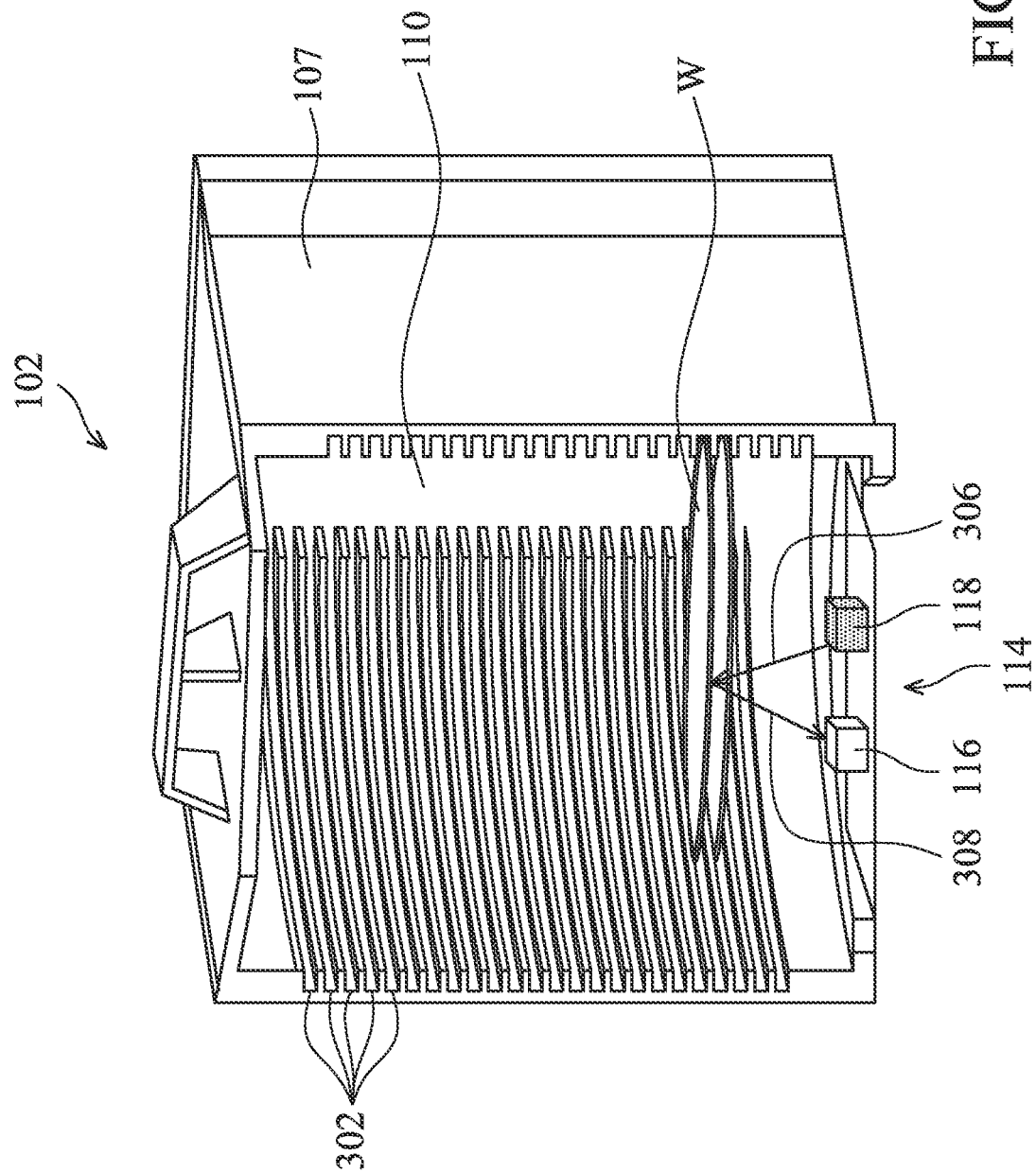
FIG. 3 depicts a cross sectional view of a substrate storage container with a substrate detecting system built therein in accordance with some embodiments.

FIG. 3 depicts a perspective view of the substrate storage container 102 with the substrate detecting system 114 disposed therein along. The perspective view of FIG. 3 is along line A-A depicted in FIG. 2. The substrates W are transferred into the interior volume 110 of the substrate storage container 102 by a substrate handler, such as a robot, and are placed in the slots 302 in the substrate storage container 102. Typically, the substrate storage container 102 includes multiple slots 302 and each slot 302 holds one substrate. A slot 302 is open on one side to allow a substrate to be removed. A slot establishes the position of a substrate. The height of a substrate above the base board 104 of the substrate storage container 102 is established to allow a substrate to be picked without collision.

In the example depicted in FIG. 3, the substrate detecting system 114 is positioned on the base board 104, e.g., a bottom portion, of the substrate storage container 102. As the emitter 118 is positioned to face a back surface of the substrate W, the beam of light 306 from the emitter 118 is emitted to the back surface of the substrate W while in operation. The receiver 116 then collects the beam of light 308 (e.g., the signal) reflected from the back surface of the substrate W. The emitter 118 is positioned and/or oriented to view a zone or across the surface of the substrate W, and the substrate detecting system 114 is capable of sensing the surface conditions as well as the substrate flatness across or in certain zones of the substrate W.

In operation, the receiver 116 receives an indication of substrate conditions or substrate flatness (e.g., substrate warpage) from the emitter 118. The receiver 116 may be multi-wavelength detector, or a spectrometer. Based on the indication received from the reflected beam of light 308 from the receiver 116, a computing system (e.g., the signal processor 412 in FIGS. 4A-4B) calculates portions of the real-time waveform and compares it with a stored characteristic waveform pattern to extract information relating to the substrate conditions. A database library may be stored in a memory of the computing system or obtained from another statistical process control (SPC) database stored in the manufacturing facility or from an electronic design automation (EDA) system. The data stored in the database library may be obtained from historical values of substrate specifications and conditions from past processing runs of standard values (e.g., a specification) of the substrates. Thus, the standard values (e.g., a specification) may be determined and selected from these historical values of substrate measurements to best fit the substrate conditions after processes are performed on the substrate. The calculation may be based on slope changes or other characteristic changes in the detected signals, such as in reflection or transmission mode. In some embodiments, more detailed calculations may be performed based on reflection data obtained over a wide spectrum in order to determine the substrate surface condition, as well as substrate flatness (e.g., substrate warpage).

Thus, after the received signals are analyzed and compared with the database library, deviation and mismatched values/responses from the receiver 116 may be found. Subsequently, a decision/action may be made to correct, calibrate, terminate, re-work, or abandon the problematic substrates as needed. Early detection of the problematic substrates or abnormal substrates enables real-time action on the substrate W that has defects and/or substrate issues. Late detection or discovery of the defects on the substrates may result in unnecessary and/or redundant process steps performed on the substrate that is eventually scrapped or abandoned. Thus, early detection of the defects formed on the substrate may eliminate or reduce manufacturing time/cycles performed on the problematic substrate, thus saving manufacturing cost and improving product yield. Furthermore, early detection of the defects may also permit early remedial steps to be performed on the substrate W so as to timely rework or re-process the substrate W to avoid unnecessary process steps.

In the embodiment depicted in FIG. 3, the substrate detecting system 114 is in operation to detect the substrate condition of the substrate W positioned in the substrate storage container 102. The substrate W remains in a stationary state in this example while the emitter 118 may be movable linearly or circularly as needed to obtain the information or measuring points on the substrate W.

Figure 4A:
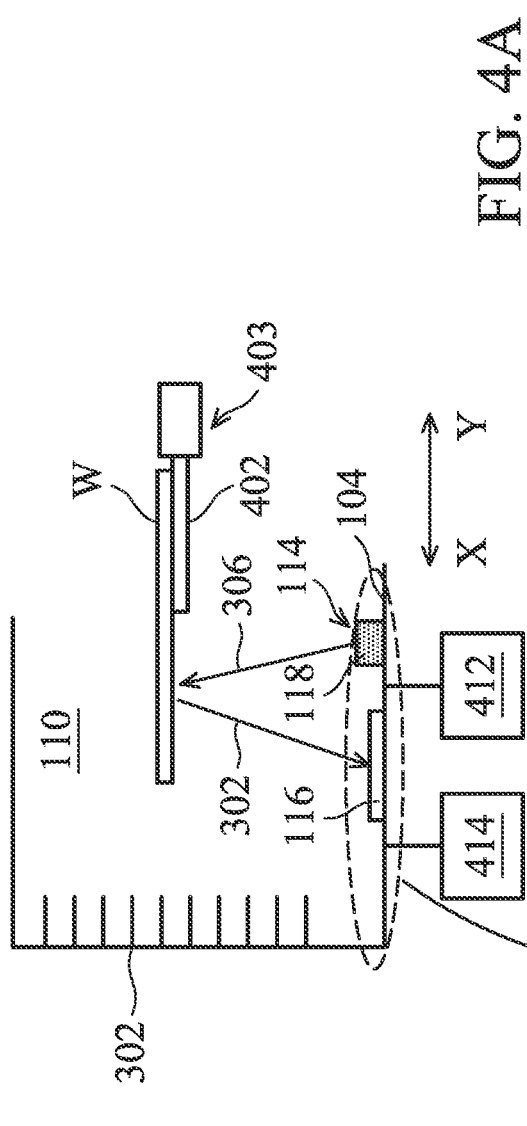
FIG. 4A depicts a cross sectional view of a substrate storage container with a substrate detecting system built therein in accordance with some embodiments.

FIG. 4A depicts a cross sectional view of the substrate storage container 102 along line B-B. The substrate storage container 102 is in an open state that allows the substrate W to be transferred into and out of the substrate storage container 102. When the front door 107 is opened, a robot 403 can access the interior volume 110 of the substrate storage container 102 to retrieve the substrate W from the substrate storage container 102. While retrieving the substrate W from the substrate storage container 102, the robot 403 with a blade 402 (or an end effector) can extend to the space between the slots 302 where each substrate W is located. Each slot 302 establishes the position of a substrate so that the blade 402 may be inserted between the substrates W without touching or scratching the substrates W. The blade 402 is then lifted up to pick up the substrate W from the back surface of the substrate W. Additionally or alternatively, the substrate W may be lowered onto the blade 402.

Figure 5A:
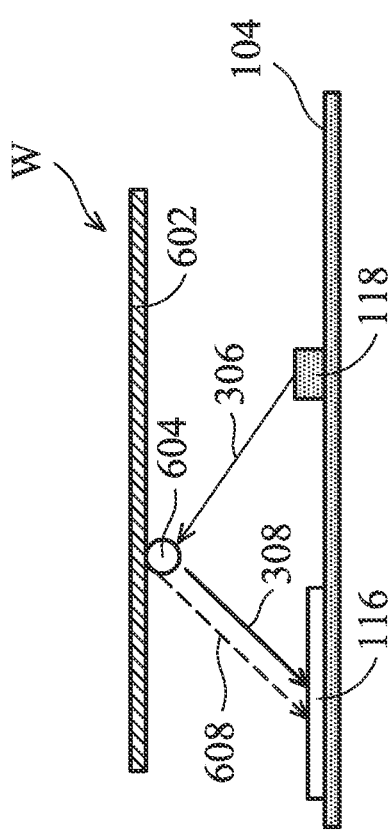
FIG. 5A-5B depict examples of light beams from a substrate detecting system emitted to a substrate placed in a substrate storage container in accordance with some embodiments.

When the blade 402 moves the substrate W in a linear direction to retrieve the substrate W from the substrate storage container 102, the emitter 118 is activated to emit the beam of light 306 to scan the predetermined measuring points/locations on the back surface of the substrate W. While scanning, the appearance, profile, surface conditions as well as substrate flatness, e.g., warpage, may be predicted, calculated, and/or determined based on the reflected beam of light 308 received by the receiver 116. Referring first to FIG. 5A, when a back surface 602 of the substrate W has a particle 604 present, the beam of light 308 reflected therefrom may be shifted, angled, or low in intensity, as shown in the dotted line 608, thus indicating an unexpected or a foreign object detected on the back surface 602 of the substrate W. Based on the received data points, a decision is then made to determine if remedial processing is required, such as a backside surface cleaning process, backside polishing process, or further substrate inspection process, for process quality control of the substrate in production line.

Figure 4B:
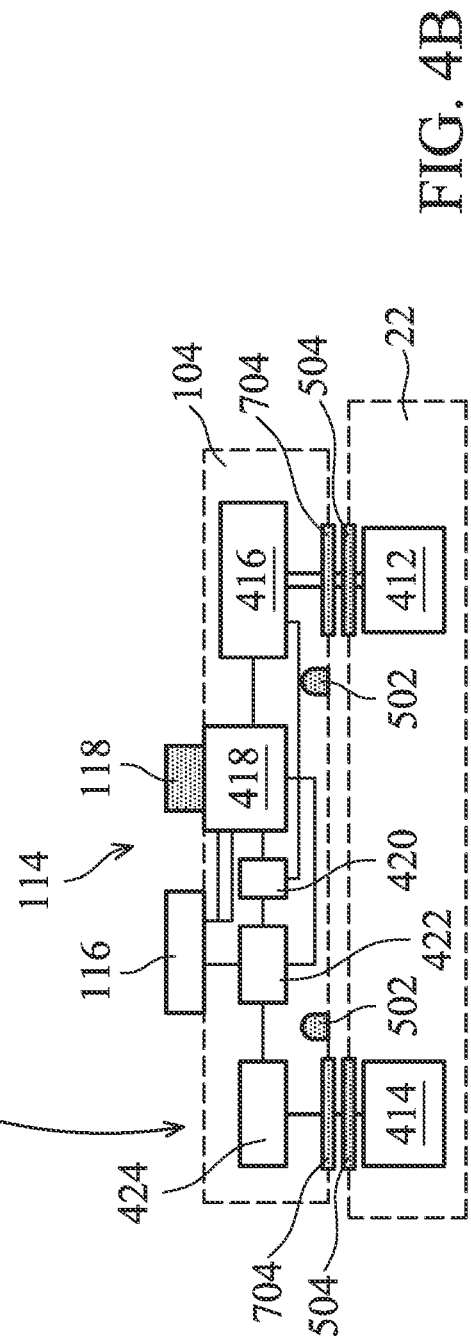
FIG. 4B depicts a schematic view of a base of the substrate storage container of FIG. 4A in accordance with some embodiments.
Figure 5B:
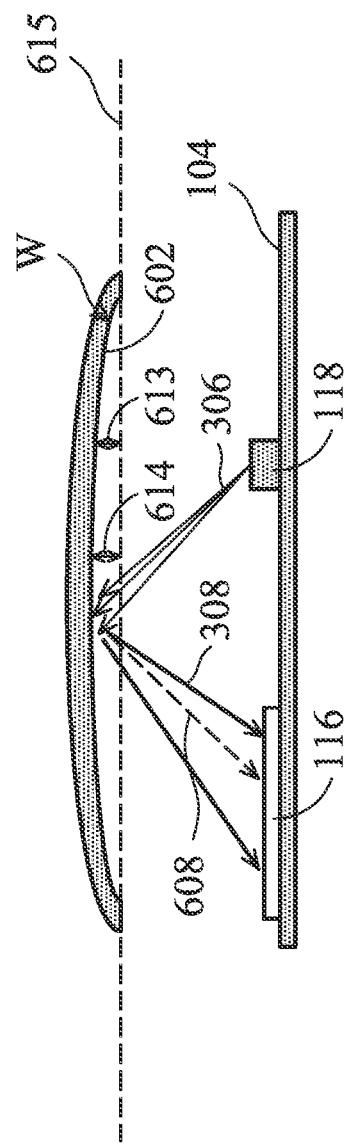

In another example depicted in FIG. 5B, when the emitter 118 is activated, the reflected beam of light 608, 308 received by the receiver 116 indicates warpage deviation (e.g., a height difference between a first height 614 and a second height 613 located at different measuring points of the substrate W) relative to a horizontal plane 615. Quantities of displacement based on the warpage data deviation (e.g., height difference between the first height 614 and the second height 613) at the predetermined measuring points relative to the flatness of the desired horizontal plane 615 is then determined and computed. As the flatness of a substrate may significantly affect the resolution and alignment precision in a lithography process, a high level of flatness of the substrate is generally desired to define a proper focal plane for the lithography exposure process. Thus, based on the quantities of displacement measured, the flatness of the substrate W is determined. As a result, a decision can then made as to whether the flatness satisfies a flatness standard value required for an accurate lithography exposure process. The flatness standard value is determined in advance based upon the focal depth of the lithography optical apparatus. The flatness standard value may be stored in the data library in the computing system (such as the signal processor 412 in FIGS. 4A-4B). As depicted in FIG. 5B, due to the curvature or warpage of the substrate W, the reflected beam of light 308, 608 measured at different measuring points indicates variations in height (e.g., height difference between the first height 614 and the second height 613). Thus, the reflected beam of lights 308, 608 detected by the receiver 116 indicates signals with different intensities, and waveforms detected so that a computing or calculating process may be performed to calculate the deformation/curvature variations of the substrate W.

Referring back to FIG. 4A, the substrate detecting system 114 is positioned at a predetermined location in the substrate storage container 102. In the example depicted in FIG. 4A, the substrate detecting system 114 is disposed on the base board 104, which forms a bottom part of the substrate storage container 102.

FIG. 4B depicts a schematic view of the base board 104 of the substrate storage container 102. The base board 104 further includes a plurality of components embedded therein to facilitate operation of the substrate detecting system 114. In some embodiment, the emitter 118 is communicatively coupled to a sensor controller 418. The sensor controller 418 is configured to control operation of the emitter 118. The sensor controller 418 may provide operating mechanisms for the emitter 118 to detect a condition, such as direction, inclination, or acceleration of the substrate W in at least X-Y directions when the substrate W is retrieved from the substrate storage container 102.

The sensor controller 418 is also in electrical communication with the receiver 116. The sensor controller 418 is further configured to control the operation of the receiver 116. A motor 420 is coupled to the sensor controller 418. The motor 420 is further mechanically coupled to the emitter 118. Under control of the sensor controller 418, the motor 420 is configured to rotate, spin, move, elevate, accelerate or lift the emitter 118 so as to provide a desired emitting angle to the substrate W for detection.

The motor 420 and the sensor controller 418, in some examples, are powered by a battery 422. The battery 422 is further wired to a power input 424, which may be further connected to an electrical power source 414 embedded in the base frame 22 in the load port 202 by cable connection, direct conductive contact, or wireless communication when the substrate storage container 102 is docked on the base frame 22. Thus, the battery 422 is rechargeable when plugging into or by wireless communication with the electrical power source 414 in the base frame 22 through the power input 424, such as when the power level of the battery 422 is low or consumed. It is noted that the battery 422 may also be charged wirelessly without plugging the substrate storage container 102 into the electrical power source 414. For example, the battery 422 can be charged wirelessly via inductive charging. It is noted that an additional charging board may also be present to increase the inductive charging rate.

When the substrate storage container 102 is placed on the base frame 22 in the load port 202, the substrates W are then retrieved from the substrate storage container 102 for processing in the processing apparatus 250. Further, the battery 422 in the substrate storage container 102 may be recharged by the electrical power source 414 in the base frame 22. Thus, while the substrate storage container 102 is placed on the base frame 22 (e.g., during performance of the processes on the substrates W in the processing apparatus 250), the battery 422 is recharged, thus efficiently utilizing wait time in the load port 202 for battery charging.

In some examples, the battery 422 embedded in the base board 104 of the substrate storage container 102 provides the required power for operation of the substrate detecting system 114 when the substrate storage container 102 is not connected to the electrical power source 414. Thus, the substrate detecting system 114 may remain in operation even during transportation of the substrate storage container 102 from a first processing apparatus to a second processing apparatus in a semiconductor facility. By doing so, the substrate detection/inspection/measurement may be performed during the transportation time. Thus, upon completion of the first process in the first processing apparatus and/or while the substrate storage container 102 is being physically transported to the location where the second processing apparatus is located, the substrate detection/inspection/measurement may be completed within the substrate storage container 102, and a determination can then be made whether to resume/continue the subsequent processes on the substrates W or pursue additional remedial processing or rework on the substrates W. Thus, an extra step of metrology or substrate detection/measurement process may be eliminated to improve process cycle time and manufacturing utility time by performing the substrate detection/measurement process in the substrate storage container 102.

In some examples, the sensor controller 418 is further coupled to a signal controller 416. The signal controller 416 controls the type of signals that may be transmitted to the sensor controller 418 so as to provide a desired type of beam of light, signal, such as at a desired wavelength, light intensity, or incident angle emitted from the emitter 118. The signal controller 416 may be further communicatively coupled to a signal processor 412 in the base frame 22 by electrical contact or wireless communication. The signal processor 412 can provide a signal command and/or can process the signal (e.g., an electronic and/or digital representation of the reflected beam of light 308) received from the receiver 116. After the signal is received, the signal processor 412 analyzes, calculates, and compares the signal from the data library to determine if any action is to be performed on the substrate. Additionally, the signal processor 412, after analysis, also can provide an adjustment to the emitter 118 and/or to the receiver 116 to better track, monitor, scan, detect and measure the condition of the substrate W. Thus, upon placing the substrate storage container 102 on the base frame 22, data transmission is activated, unidirectional and/or bidirectional, between the signal processor 412 and the emitter 118 and/or the receiver 116 so as to manage and control the substrate measurement/detection process and to determine whether remedial actions are to be performed on the problematic substrates, if necessary. In some cases, the data transmission is activated wirelessly without physically placing the substrate storage container 102 on the base frame 22. Thus, the emitter 118 and/or the receiver 116 may be adjusted or altered based on the data transmitted from the signal processor 412 wirelessly.

Figure 6:
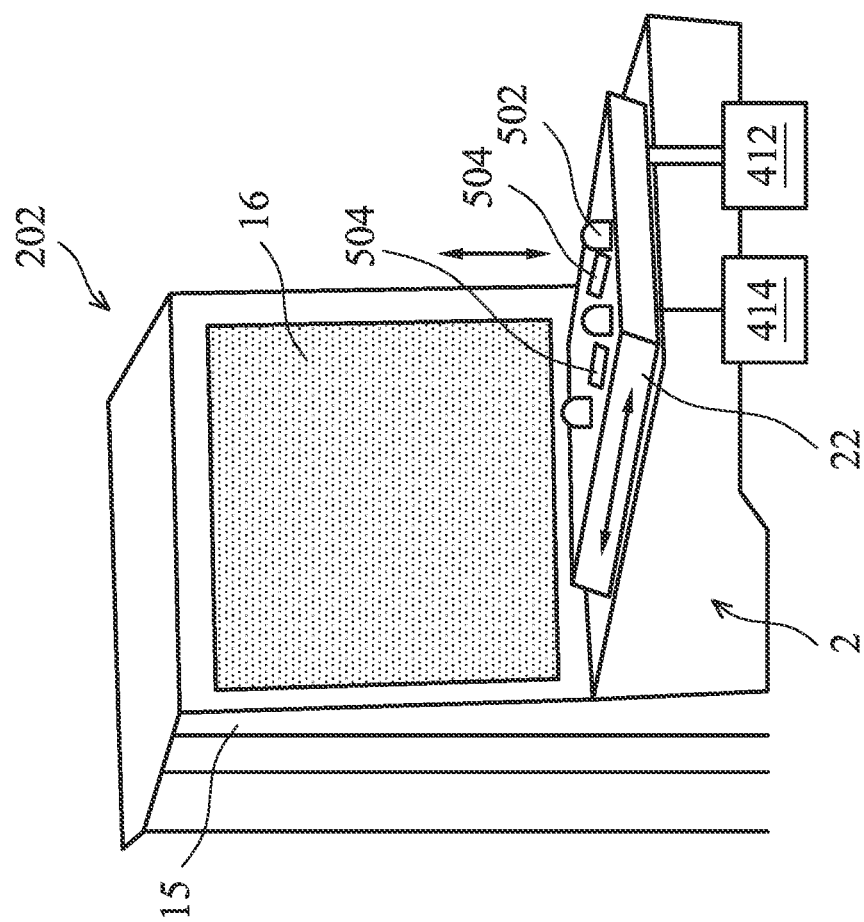
FIG. 6 depicts an example of a base decking station disposed on a table of a load port in accordance with some embodiments.
Figure 7:
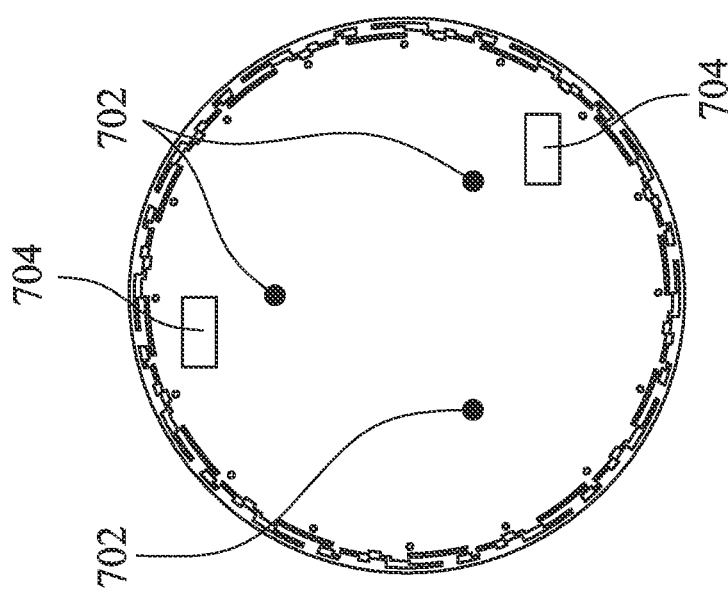
FIG. 7 depicts a bottom view of a substrate storage container in accordance with some embodiments.

FIG. 6 depicts a front view of the load port 202 where the substrate storage container 102 is placed for transferring wafers from the substrate storage container 102 into the processing apparatus. The load port 202 includes the base frame 22 on the platform table 2. A plurality of positioning pins 502 is disposed on the base frame 22. The positioning pins 502 project above an upper surface of the base frame 22 and are arranged to match with a plurality of positioning holes 702 on a bottom surface of the base board 104 of the substrate storage container 102, as shown in a bottom view of the base board 104 in FIG. 7. The positioning pins 502 and the positioning holes 702 allow the substrate storage container 102 to be precisely, securely, and repeatedly positioned on the base frame 22 in the desired position. In the embodiment depicted herein, three positioning holes 702 are provided to match with the three positioning pins 502. It is noted that any number of the positioning holes 702 and the positioning pins 502 may be implemented in other examples. In some examples, the substrate storage container 102 rests by gravity on the surface of the base frame 22.

The base frame 22 further includes multiple contact pads 504 configured to contact with the contact pads 704 on the bottom surface of the base board 104 of the substrate storage container 102. The contact pads 504 in the base frame 22 are further electrically coupled to the signal processor 412 and the electrical power source 414 embedded in the body of the base frame 22. The exposure of the contact pads 504 on the surface of the base frame 22 allows an electrical connection with the contact pads 704 on the base board 104 of the substrate storage container 102. In some configurations, the signal processor 412 and the electrical power source 414 may be further down in the platform table 2 utilizing wires or cables to be in electrical communications with the contact pads 504 on the surface of the base frame 22.

Similarly, the contact pads 704 on the bottom surface of the base board 104 are further electrically coupled to the signal controller 416 and the power input 424 embedded in the body of the base board 104 in the substrate storage container 102. Electrical or physical contact between the contact pads 704, 504 allows electrical communication from the signal controller 416 and the power input 424 to the signal processor 412 and the electrical power source 414 respectively. In some examples, the signal controller 416 and the power input 424 can communicate with the signal processor 412 and the electrical power source 414 wirelessly. It is noted that the dimensions of the contact pads 504, 704 may be in any suitable size as long as the contact pads 504, 704 can allow current or electrical connection flowing therethrough from the signal controller 416 and the power input 424 to the electrical power source 414 and the signal processor 412, or vice versa.

Figure 8A:
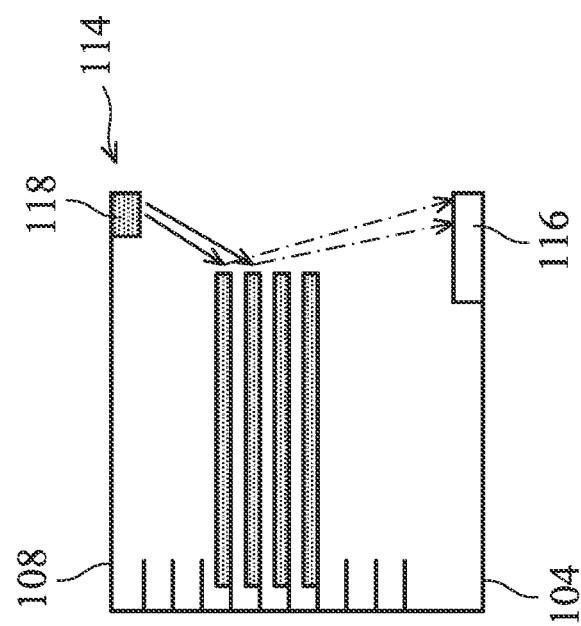
FIG. 8A depicts a cross sectional view of another example of a substrate storage container with a substrate detecting system built therein in accordance with some embodiments.

FIGS. 8A-8C depicts different examples of the substrate detecting system 114, 802 located at different locations of the substrate storage container 102. The substrate detecting system 114, as shown in FIG. 8A, may be positioned on an edge of the substrate storage container 102. More specifically, the emitter 118 is positioned on the edge of the lid 108, while the receiver 116 is positioned on the edge of the base board 104. The emitter 118 positioned on the edge of the lid 108 may emit a beam of light to an edge of the substrate W so as to monitor the edge particles, edge residuals, and/or edge profile of the substrate. It is noted that edge deposition may often occur from previous process steps performed on the substrate, which may result in substrate flatness and thickness deviation, which may adversely impact the focus resolution during a lithography process. Furthermore, edge deposition on the substrate can also result in particles where the end effector as the robot often grips the substrate edge, and thus, the end effector can cause chipping and scratching of the film materials accumulated on the substrate edge, which can result in causing a contamination source. Thus, monitoring/detecting of a state or profile of the substrate edge may assist determining whether processing performed on the substrate caused substrate edge film accumulation to be present, and if so, may assist determining whether remedial processing should be performed to prevent additional particle generation. Although the example depicted in FIG. 8A shows that the emitter 118 is located on the lid 108 and the receiver 116 is located on the base board 104, it is noted that the position of the emitter 118 and the receiver 116 may be switched or in other suitable positions.

In other examples, the substrate detecting system 114 is located and installed on the lid 108 of the substrate storage container 102 to detect a front surface condition of the substrate, as shown in FIG. 8B.

FIG. 8C depicts a substrate detecting system 802 including a rotatable emitter 804 utilized with a receiver 806. As the emitter 804 is rotatable, the measuring points on the substrate may be increased and selected across different locations of the substrate to promote the accuracy of the substrate profile prediction.

FIG. 9A depicts another example of a substrate detecting system 902 that includes an image sensor 904. The image sensor 904 may be a charged-coupled device (CCD) or a complementary metal-oxide-semiconductor (CMOS) image sensor. The image sensor 904 is controlled by the sensor controller 906 embedded in the base frame 22, as further depicted in FIG. 9B. The sensor controller 906 is further connected to a motor 420 and a battery 422. The motor 420, based on the control of the sensor controller 906, controls the movement of the image sensor 904. The battery 422 may be recharged by the electrical power source 414 through the power input 424 in the similar fashion as described above with referenced to FIG. 4B.

The image sensor 904 includes a camera that can capture an image of the substrate surface. The image sensor 904 is further coupled to a signal processor 910 through a signal controller 908. The image sensor 904 provides the signal processor 910 with a data signal defining an image on based on the signals, e.g., beam of light, received by the image sensor 904, and the signal processor 910 processes the signal supplied from the image sensor 904. The data signal is then transmitted to the signal processor 910 for further analysis and is compared with images stored in the data library so as to determine if an action is required to be performed on the substrate W for process quality management and control.

Figure 10B:
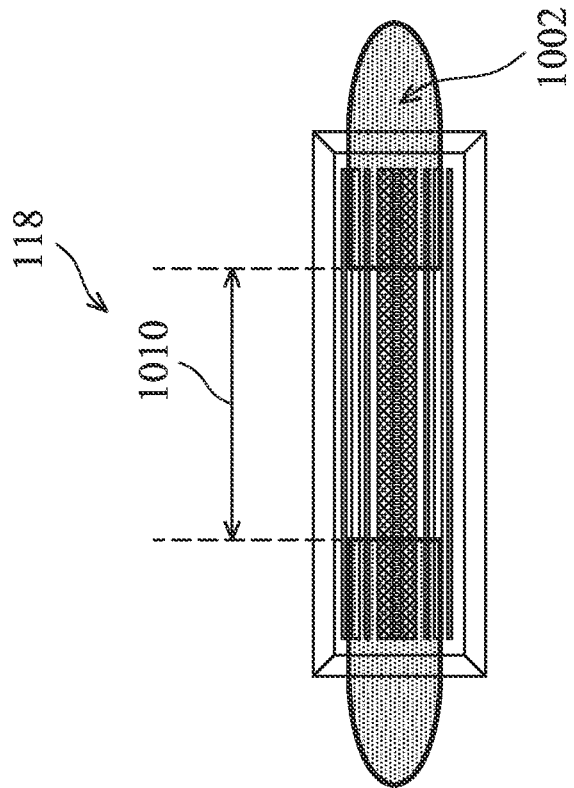
FIG. 10A-10B depict a top view of a substrate detecting system in accordance with some embodiments.
Figure 10A:
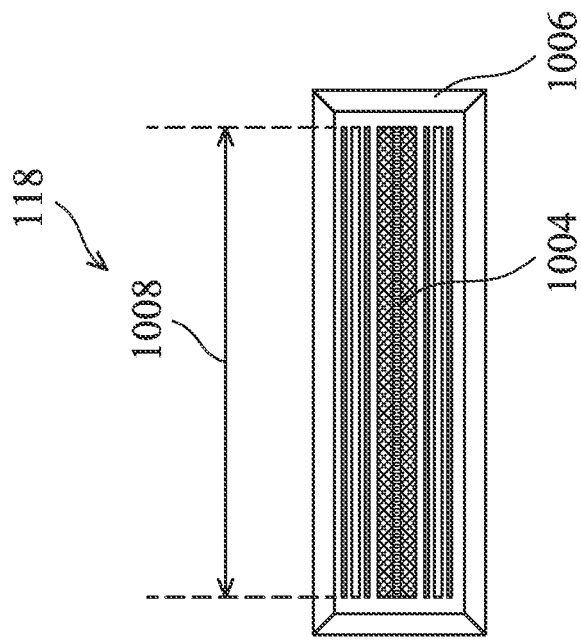

FIGS. 10A-10B depict top views of the emitter 118. The emitter 118 includes a plurality of light sources 1004 on a supporting base 1006. The light sources 1004 emit the beam of light at a desired wavelength, such as from 150 nm to 2000 nm. The plurality of light sources 1004 has a first width 1008 that can emit a beam of light to different measuring points across the substrate. In the examples wherein the substrate has a smaller dimension, a shield 1002 that is moveable and trackable is used to adjust and reduce a width through which beams of light from the light source 1004 are emitted to the substrate. As illustrated, the shield 1002 can reduce the first width 1008 to a second width 1010. The reduced second width 1010 can accommodate the smaller dimension of a substrate to provide beams of light to the desired measuring locations on the substrate without undesired reflection.

Figure 11:
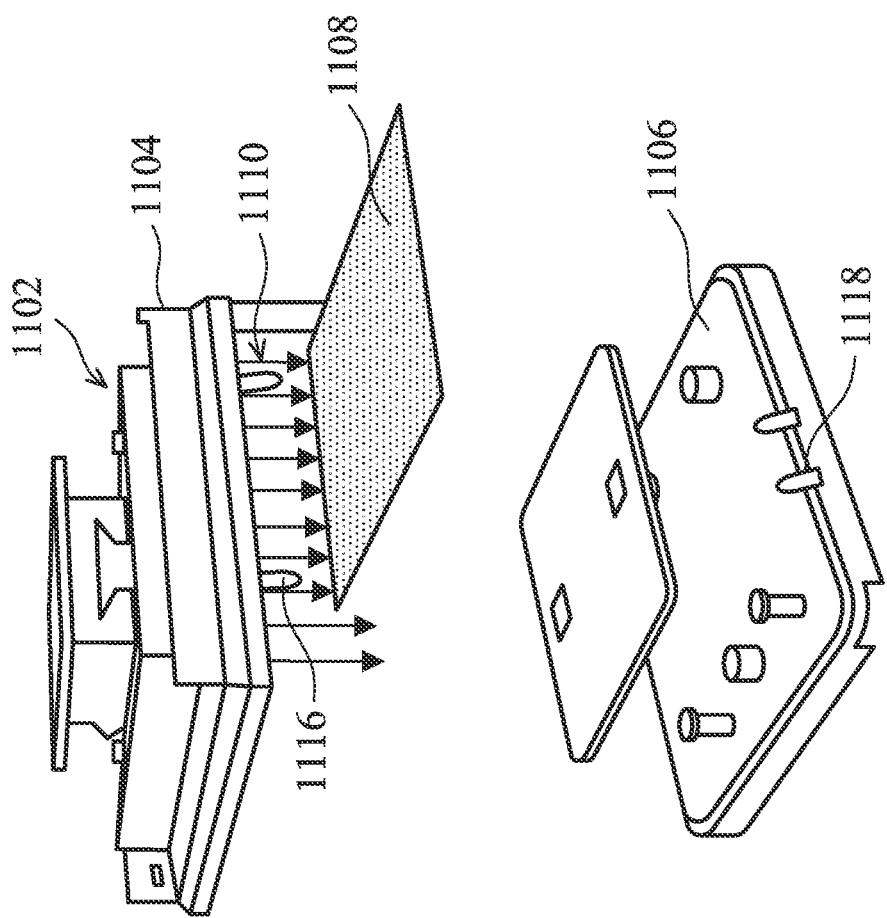
FIG. 11 depicts another example of a substrate storage container in accordance with some embodiments.

FIG. 11 depicts an exploded view of another example of a substrate storage container 1102. The substrate storage container 1102 includes a lid 1104, a bottom 1106, and a sidewall body (not shown) disposed between. The lid 1104, bottom 1106, and sidewall body together define an interior volume that allows a photomask reticle 1108 to be stored therein. The photomask reticle 1108 has a rectangular shape having sides between about 5 inches to about 9 inches in length. The photomask reticle 1108 may be between about 0.15 inches and about 0.25 inches thick. The photomask reticle 1108 typically includes an optically transparent silicon based material, such as quartz or low thermal expansion glass layer, having a film stack disposed thereon with desired features formed therein. The desired features formed in the film stack of the photomask reticle 1108 can be used to transfer features to another target substrate in a lithography process. Similar to the configuration of the substrate storage container 102 discussed above, the substrate storage container 1102 includes a substrate detecting system 1110 disposed therein. The substrate detecting system 1110 includes an emitter 1116 and a receiver 1118 disposed on the lid 1104 and the bottom 1106, respectively. It is noted that the positions of the emitter 1116 and the receiver 1118 may be changed or altered. As the photomask reticle 1108 is optically transparent, the emitter 1116 and the receiver 1118 disposed at opposite sides may utilize a light transmission mode to transmit the beam of light through the photomask reticle 1108. The description regarding the operation of the substrate detecting system 1110, data transmission, data processing, data analysis and the power backup or power charging is similarly constructed as the substrate storage container 102 described above and is eliminated herein for sake of brevity.

Figure 12:
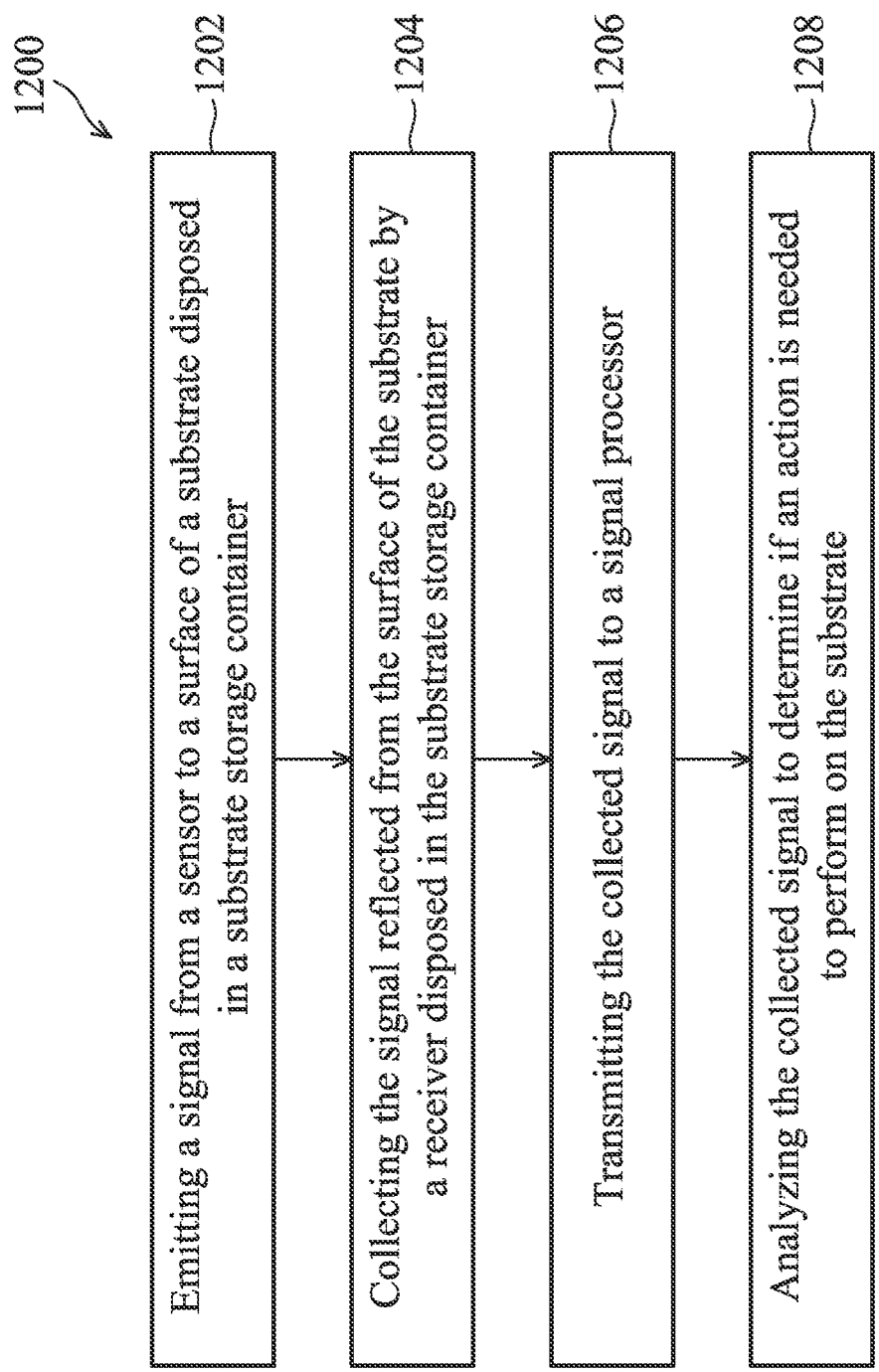
FIG. 12 depicts a flow chart for performing a substrate measurement process utilizing the substrate detecting system in the substrate storage container in accordance with some embodiments.

FIG. 12 depicts a flow chart for a substrate measurement process 1200 utilizing the substrate detecting system 114 built in the substrate storage container 102 in accordance with some embodiments. The substrate storage container 102 includes a substrate W in the substrate storage container 102. It is noted that more than one substrate W may be provided in the substrate storage container 102 as needed.

At operation 1202, a signal (e.g., the beam of light 306) is then emitted from the emitter 118 to the surface 602 of the substrate W. At operation 1204, the reflected signal (e.g., the reflected beam of light 308, 606, 608) is then collected by the receiver 116. At operation 1206, the collected signal is then transmitted to the signal processor 412, 910 for analysis so as to determine of a remedial action is required to be performed on the substrate W.

Embodiments described herein provide a substrate detecting system disposed in a substrate storage container. As the substrate storage container is portable, the substrate detecting system disposed in the substrate storage container can perform a substrate measurement/inspection process at any time in the production line when a substrate is present in the substrate storage container. The substrate measurement/inspection process can measure the substrate surface conditions, profiles, topography, warpage, and/or flatness of the substrates stored and/or transferred in and out of a substrate storage container. By utilizing the substrate detecting system embedded in the substrate storage container, the substrate surface conditions, profiles, topography, warpage, and/or flatness can be detected when the substrates are stored in the substrate storage container or transferred in and out of the substrate storage container. Thus, problematic substrates can be detected earlier during fabrication, and remedial actions can be executed earlier during fabrication on the problematic substrates so as to save manufacturing cost and improve throughput and cycle times.

In an embodiment, a method of performing a substrate detection process includes emitting a signal to a surface of a substrate from an emitter disposed in a substrate storage container, collecting the signal reflected from the surface of the substrate by a receiver disposed in the substrate storage container, transmitting data corresponding to the collected signal to a signal processor, analyzing the data, and determining whether an action is to be performed on the substrate based on the analyzing.

In an embodiment, the data is transmitted to the signal processor wirelessly.

In an embodiment, the data is transmitted to the signal processor by electrically connecting the receiver to the signal processor disposed in a base frame of a load port in a processing apparatus.

In an embodiment, emitting the signal further includes rotating or controlling a movement of the emitter by a motor disposed in the substrate storage container.

In an embodiment, the emitter is rotatable relative to the receiver.

In an embodiment, the emitter and the receiver are powered by a battery disposed in the substrate storage container.

In an embodiment, the emitter and the receiver are positioned facing the surface of the substrate.

In an embodiment, the emitter and the receiver are positioned on a base board of the substrate storage container.

In an embodiment, the emitter and the receiver are positioned facing opposite surfaces of the substrate.

In an embodiment, emitting the signal further includes emitting a beam of light, and adjusting a width of the beam of light via a shield.

In another embodiment, a method of performing a substrate detection process includes: placing a substrate storage container on a load port, matching a plurality of positioning holes on a base board of the substrate storage container with a plurality of positioning pins on the load port, emitting a signal to a surface of a substrate from an emitter disposed on the base board, and collecting the signal reflected from the surface of the substrate by a receiver disposed on the base board.

In an embodiment, the method further includes: transmitting data corresponding to the collected signal to a signal processor, analyzing the data, and determining whether an action is to be performed on the substrate based on the analyzing.

In an embodiment, the data is transmitted to the signal processor wirelessly.

In an embodiment, the method further includes: receiving the substrate in one of the plurality of slots formed in a sidewall body of the substrate storage container.

In an embodiment, emitting the signal further includes: rotating or controlling a movement of the emitter by a motor disposed in the substrate storage container.

In an embodiment, the method further includes: powering the motor by a battery embedded in the base board.

In an embodiment, the battery is rechargeable wirelessly via inductive charging.

In yet another embodiment, a method of performing a substrate detection process includes: emitting a signal to a surface of a substrate from an emitter disposed in a substrate storage container, collecting the signal reflected from the surface of the substrate by a receiver disposed in the substrate storage container, and rotating the emitter relative to the receiver to select measuring points on the substrate.

In an embodiment, the method further includes: transmitting data corresponding to the collected signal to a signal processor, analyzing the data, and determining whether an action is to be performed on the substrate based on the analyzing.

In an embodiment, the data is transmitted to the signal processor wirelessly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of performing a substrate detection process, the method comprising:
    emitting a signal to a surface of a substrate from an emitter disposed in a substrate storage container, wherein the surface of the substrate is substantially parallel to a base board of the substrate storage container, a plurality of positioning holes are on the base board of the substrate storage container for matching with a plurality of positioning pins on a load port, the emitter and the plurality of positioning holes are spaced apart from each other in a direction substantially perpendicular to the surface of the substrate;
    collecting the signal reflected from the surface of the substrate by a receiver disposed in the substrate storage container;
    transmitting data corresponding to the collected signal to a signal processor;
    analyzing the data; and
    determining whether an action is to be performed on the substrate based on the analyzing.

2. The method of claim 1, wherein the data is transmitted to the signal processor wirelessly.

3. The method of claim 1, wherein the data is transmitted to the signal processor by electrically connecting the receiver to the signal processor disposed in a base frame of the load port in a processing apparatus.

4. The method of claim 1, wherein the emitter and the receiver are powered by a battery disposed in the substrate storage container.

5. The method of claim 1, wherein the emitter and the receiver are positioned facing opposite surfaces of the substrate.

6. The method of claim 1, wherein emitting the signal further comprises:
    emitting a beam of light; and
    adjusting a width of the beam of light via a shield.

7. The method of claim 1, wherein emitting the signal further comprises:
    rotating or controlling a movement of the emitter by a motor disposed in the substrate storage container.

8. The method of claim 7, wherein the emitter is rotatable relative to the receiver.

9. The method of claim 1, wherein the emitter and the receiver are positioned facing the surface of the substrate.

10. The method of claim 9, wherein the emitter and the receiver are positioned on a base board of the substrate storage container.

11. A method of performing a substrate detection process, the method comprising:
- placing a substrate storage container on a load port;
- matching a plurality of positioning holes on a base board of the substrate storage container with a plurality of positioning pins on the load port;
- emitting a signal to a surface of a substrate from an emitter disposed on the base board; and
- collecting the signal reflected from the surface of the substrate by a receiver disposed on the base board.

12. The method of claim 11, further comprising:
receiving the substrate in one of a plurality of slots formed in a sidewall body of the substrate storage container.

13. The method of claim 11, further comprising:
- transmitting data corresponding to the collected signal to a signal processor;
- analyzing the data; and
- determining whether an action is to be performed on the substrate based on the analyzing.

14. The method of claim 13, wherein the data is transmitted to the signal processor wirelessly.

15. The method of claim 11, wherein emitting the signal further comprises:
rotating or controlling a movement of the emitter by a motor disposed in the substrate storage container.

16. The method of claim 15, further comprising:
powering the motor by a battery embedded in the base board.

17. The method of claim 16, wherein the battery is rechargeable wirelessly via inductive charging.

18. A method of performing a substrate detection process, the method comprising:
- emitting a signal to a surface of a substrate from an emitter disposed on a top surface of a base board of a substrate storage container, wherein a plurality of positioning holes are on a bottom surface of the base board of the substrate storage container for matching with a plurality of positioning pins on a load port;
- collecting the signal reflected from the surface of the substrate by a receiver disposed on the top surface of the base board of the substrate storage container; and
- rotating the emitter relative to the receiver to select measuring points on the substrate.

19. The method of claim 18, further comprising:
- transmitting data corresponding to the collected signal to a signal processor;
- analyzing the data; and
- determining whether an action is to be performed on the substrate based on the analyzing.

20. The method of claim 18, wherein the data is transmitted to the signal processor wirelessly.

* * * * *